(12) United States Patent
Okamoto et al.

(10) Patent No.: US 7,046,113 B1
(45) Date of Patent: May 16, 2006

(54) INDUCTOR ELEMENT

(75) Inventors: Akira Okamoto, Ageo (JP); Takeshi Ikeda, Tokyo (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 721 days.

(21) Appl. No.: 10/049,580

(22) PCT Filed: Aug. 10, 2000

(86) PCT No.: PCT/JP00/05385

§ 371 (c)(1),
(2), (4) Date: Feb. 13, 2002

(87) PCT Pub. No.: WO01/13384

PCT Pub. Date: Feb. 22, 2001

(30) Foreign Application Priority Data

Aug. 17, 1999 (JP) ................. 11/230293

(51) Int. Cl.
*H01F 5/00* (2006.01)

(52) U.S. Cl. .................. 336/200
(58) Field of Classification Search .......... 336/65, 336/83, 200, 206–208, 232; 333/184–185; 257/531
See application file for complete search history.

(56) References Cited

U.S. PATENT DOCUMENTS 5,095,357 A * 3/1992 Andoh et al. ............... 257/379
6,664,863 B1 * 12/2003 Okamoto et al. ......... 331/117 R
6,842,080 B1 * 1/2005 Okamoto et al. ......... 311/117 R

FOREIGN PATENT DOCUMENTS

| EP | 0 643 402 | 3/1995 |
|---|---|---|
| JP | 6-140851 | 5/1994 |
| JP | 6-310660 | 11/1994 |
| JP | 10-74624 | 3/1998 |
| JP | 10-208940 | 8/1998 |
| JP | 11-273949 | * 10/1999 |

* cited by examiner

*Primary Examiner*—Tuyen T Nguyen
(74) *Attorney, Agent, or Firm*—Dellett & Walters

(57) ABSTRACT

An inductor element having good characteristics is formed on a substrate. An inductor element 100 includes two spiral conductors 120, 122 formed on the surface of a semiconductor substrate 110. The upper conductor 120 and the lower conductor 122 have substantially the same shape, and the conductor 120 is used as an inductor conductor, while the conductor 122 is used as a floating conductor. The outer and inner ends of the conductor 120 are connected with lead wires 130, 132, respectively, and the lead wire 132 connected with the inner ene extends outside between the lower conductor 122 and the semiconductor substrate 110.

21 Claims, 8 Drawing Sheets

INDUCTOR ELEMENT

TECHNICAL FIELD

The present invention relates to an inductor element that is formed on various kinds of substrates such as a semiconductor substrate.

BACKGROUND ART

There is known such a semiconductor circuit that forms a spiral pattern electrode on a semiconductor substrate with using thin film forming technique and uses this pattern electrode as an inductor element. If current flows in such an inductor element that is formed on such a semiconductor substrate, magnetic flux is generated in the direction perpendicular to the spiral pattern electrode. Nevertheless, since eddy currents are induced on the front side of the semiconductor substrate by this magnetic flux to cancel effective magnetic flux, there is a problem of not effectively functioning as the inductor element. In particular, the higher a frequency of a signal that flows in the inductor element becomes, the more remarkable this inclination becomes, and hence it is difficult to form a high-frequency circuit, containing an inductor element, on a semiconductor substrate.

As conventional technology for avoiding such inconvenience, an inductor element disclosed in Japanese Patent Laid-Open No. 10-208940 is known. This inductor element has two-layer structure that a floating conductor having the same shape as an inductor conductor is sandwiched between the inductor conductor and a substrate. Hence it is possible to reduce eddy currents generated on a surface of the substrate.

By the way, in the inductor element disclosed in the Japanese Patent Laid-Open No. 10-208940, the inductor conductor and the floating conductor are being superficially formed on the substrate. Hence there is a possibility of interrupting the flow of effective magnetic flux generated by the inductor conductor depending on the configuration of lead wires extended from the inductor conductor. Therefore, there is an issue that sufficient characteristics cannot be obtained. In addition, since the floating conductor is in the state where it floats thoroughly electrically, in this floating conductor, unnecessary reflection may arise depending on a frequency and the like of a signal outputted from or inputted to the inductor conductor. Hence there is a possibility that sufficient characteristics are not obtained depending on circumstances.

DISCLOSURE OF THE INVENTION

The present invention has been developed to solve the above mentioned problems, and its object is to provide an inductor element that obtains good characteristics even if the inductor element is formed on a substrate.

An inductor element of the present invention has two conductors that are formed in piles on a substrate in the state where they are mutually insulated. While one conductor separating from the substrate is used as an inductor conductor, a lead wire of this inductor conductor is led out through a gap between another conductor, being near the substrate, and the substrate. It is possible to reduce eddy currents generated on a surface of the substrate and stray capacity generated between the inductor conductor and the surface of the substrate by locating two conductors in piles on the substrate, using one conductor apart from the substrate as an inductor conductor, and making another conductor intervene between this inductor conductor and the substrate. In particular, by leading out the lead wire of this inductor conductor from between another conductor and the substrate, it becomes possible to preventing the flow of the effective magnetic flux, generated by the inductor conductor, to the minimum from being interrupted. Hence good characteristics can be obtained.

Moreover, it is desirable to form three or more layers of metal layers on the substrate described above, and to form the two conductors described above and lead wires respectively with using different metal layers which are mutually apart by one or more layers. Since the inductor conductor can be made to be apart from the lead wires by at least two or more layers by adopting such constitution, it is possible to further reduce the influence of the electric current that flows in the lead wires.

Furthermore, an inductor element of the present invention has two conductors that are formed in piles on a substrate in the state where they are mutually insulated. While using one conductor apart from the substrate as an inductor conductor, at least one end of another conductor is terminated with a predetermined impedance element. Although electric current flows also in another conductor by the effective magnetic flux generated by the inductor conductor, it becomes possible to prevent unnecessary reflection in this portion and to improve characteristics by terminating the end of another conductor with the impedance element. Therefore, good characteristics can be obtained. In addition, it is possible to adjust frequency characteristics or the like of another conductor by forming the impedance element with using any of a resistor, a capacitor, and an inductor or combining these. Hence it becomes possible also to improve characteristics by adjusting a device constant of the impedance element at a suitable value.

In addition, it is desirable to adjust termination conditions by making it possible to change at least one device constant of a resistor, a capacitor, and an inductor, which constitute the impedance element described above, and making this device constant variable. By some external means, for example, by changing a value of a control voltage applied, it becomes possible to adjust a device constant of the whole impedance element, that is, characteristics of the inductor element by a change of termination conditions.

In particular, when the substrate described above is a semiconductor substrate, it is desirable to form the capacitor where a device constant can be changed by a variable capacitance diode. While it becomes possible to miniaturize parts by using the variable capacitance diode formed with using the semiconductor substrate, it becomes possible to reduce a manufacturing cost by simplifying manufacturing process in comparison with the case where external parts are attached thereafter, and wiring etc. are performed. Similarly, when the substrate described above is a semiconductor substrate, it is desirable to form a variable resistor made of an FET whose channel is used as a resistor. While it is possible to miniaturize parts by using the variable resistor made of the FET formed with using the semiconductor substrate, it becomes possible to reduce a manufacturing cost by simplifying manufacturing process in comparison with the case where external parts are attached thereafter, and wiring etc. are performed.

In addition, it is desirable to form an inductor, which constitutes the impedance element, by a conductive layer formed on the substrate in predetermined shape. Since high Q is not required of the inductor used for terminating the end of a conductor, it is possible to realize the inductor with a conductor pattern on the substrate. Moreover, since it becomes possible to form this conductor pattern at the same process with using a metal layer for performing various kinds of wiring etc., it becomes possible to perform miniaturization of parts, simplification of process, and cost reduction.

In addition, it is desirable to form two conductors, described above, in the substantially same shape or long shape. Since an upper conductor never directly faces the front side of the substrate owing to making the two conductors the same in shapes, it is possible to reduce the eddy currents that are generated on the substrate when the upper conductor directly faces the substrate. In addition, it is possible to give predetermined inductance to the upper conductor by making the shapes of the two conductors be long. In particular, since it is possible to give large inductance to a conductor when the conductor is formed in one or more turns of spiral shape or a meander shape, the conductor is suitable for being built in a comparatively low frequency circuit. In addition, since it is possible to give a small inductance to a conductor when the conductor is formed in a circular shape less than one turn or an substantially linear shape in comparison with the case where the conductor is formed in a spiral shape or the like, the conductor is suitable for being built in a comparatively high frequency circuit.

In addition, when the shape is a spiral one having one or more turns, it is necessary to extend a lead wire from the inner circumferential end of the inductor conductor having this spiral shape. Nevertheless, it is possible to suppress to the minimum the interruption of flow of the effective magnetic flux, generated by the inductor conductor, by leading out the lead wire between the conductor, being near the substrate, and the substrate.

In addition, the inductor element described above is suitable for use as a compound element that also has a capacitance component besides an inductance component. Since this inductor element has two conductors that are superimposed one on the other and its characteristics also include a capacitance component, this inductor element can be used in applications where an inductor and a capacitor are combined for making them a part of a circuit.

BEST MODE FOR CARRYING OUT THE INVENTION

Hereafter, an inductor element according to an embodiment where the present invention is applied will be specifically described with referring to drawings.

FIRST EMBODIMENT

Figure 1:
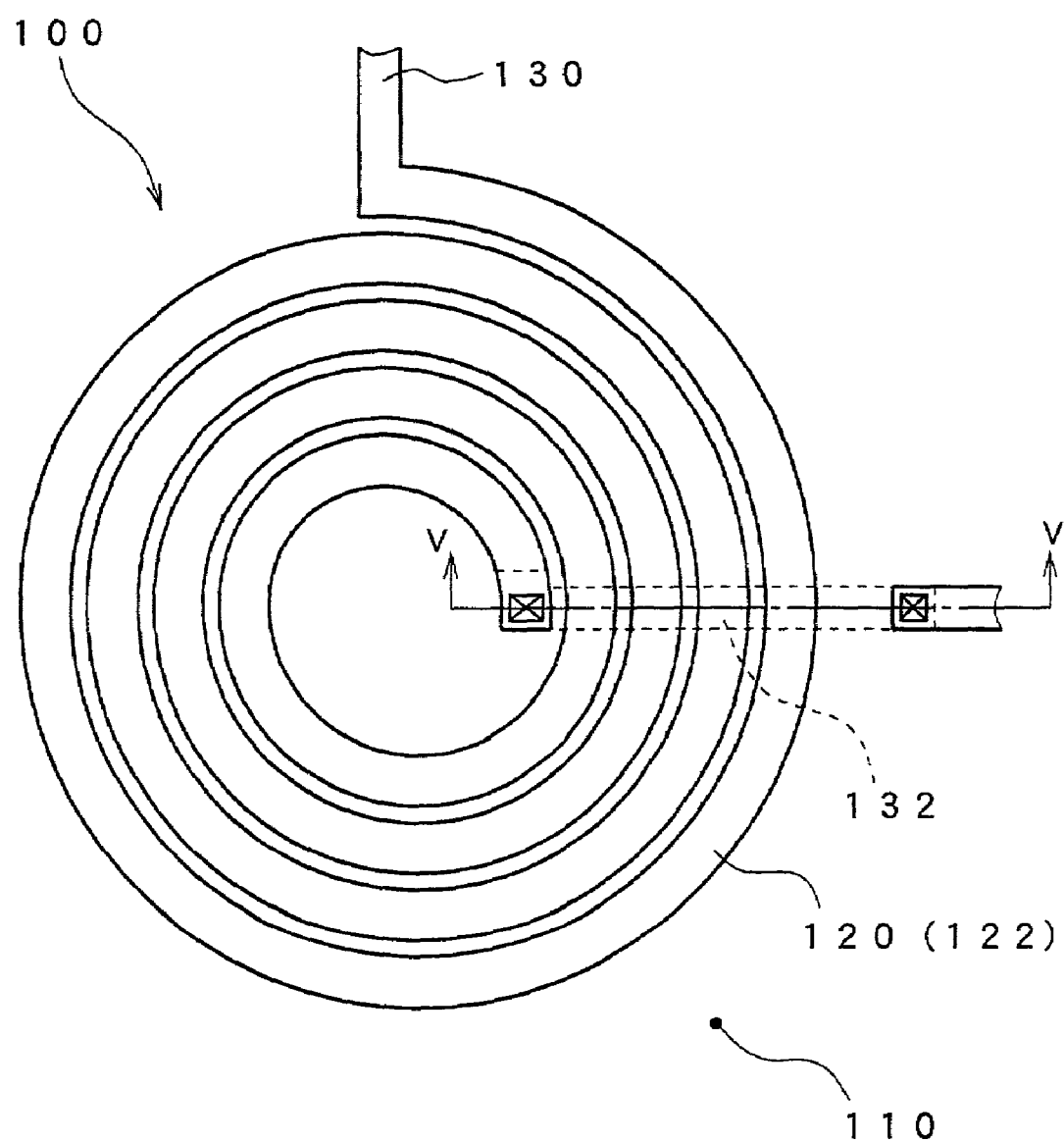
FIG. 1 is a schematic diagram showing a planar structure of an inductor element according to a first embodiment.
Figure 2:
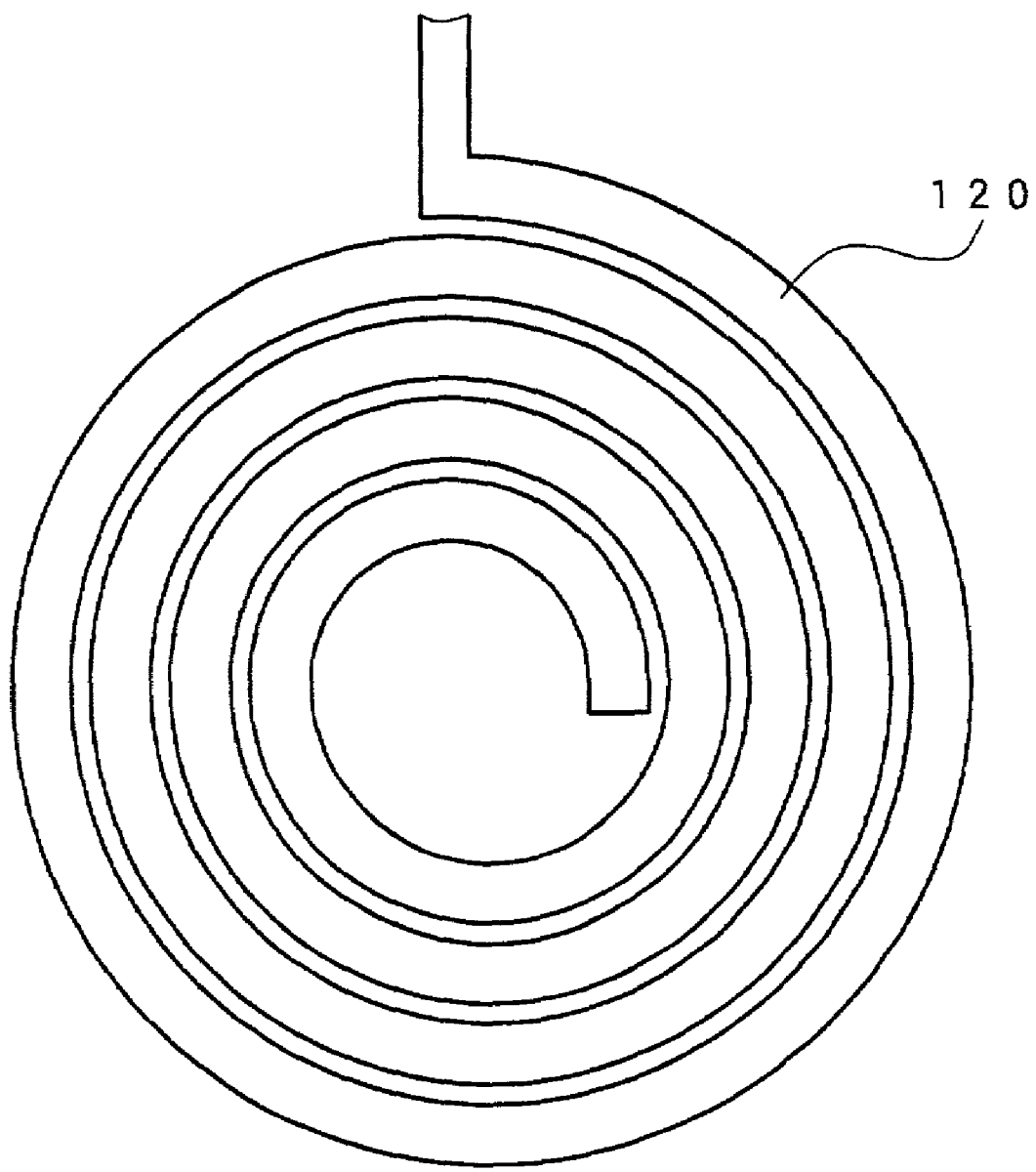
FIG. 2 is a drawing showing an upper layer of conductor included in the inductor element shown in FIG. 1.
Figure 3:
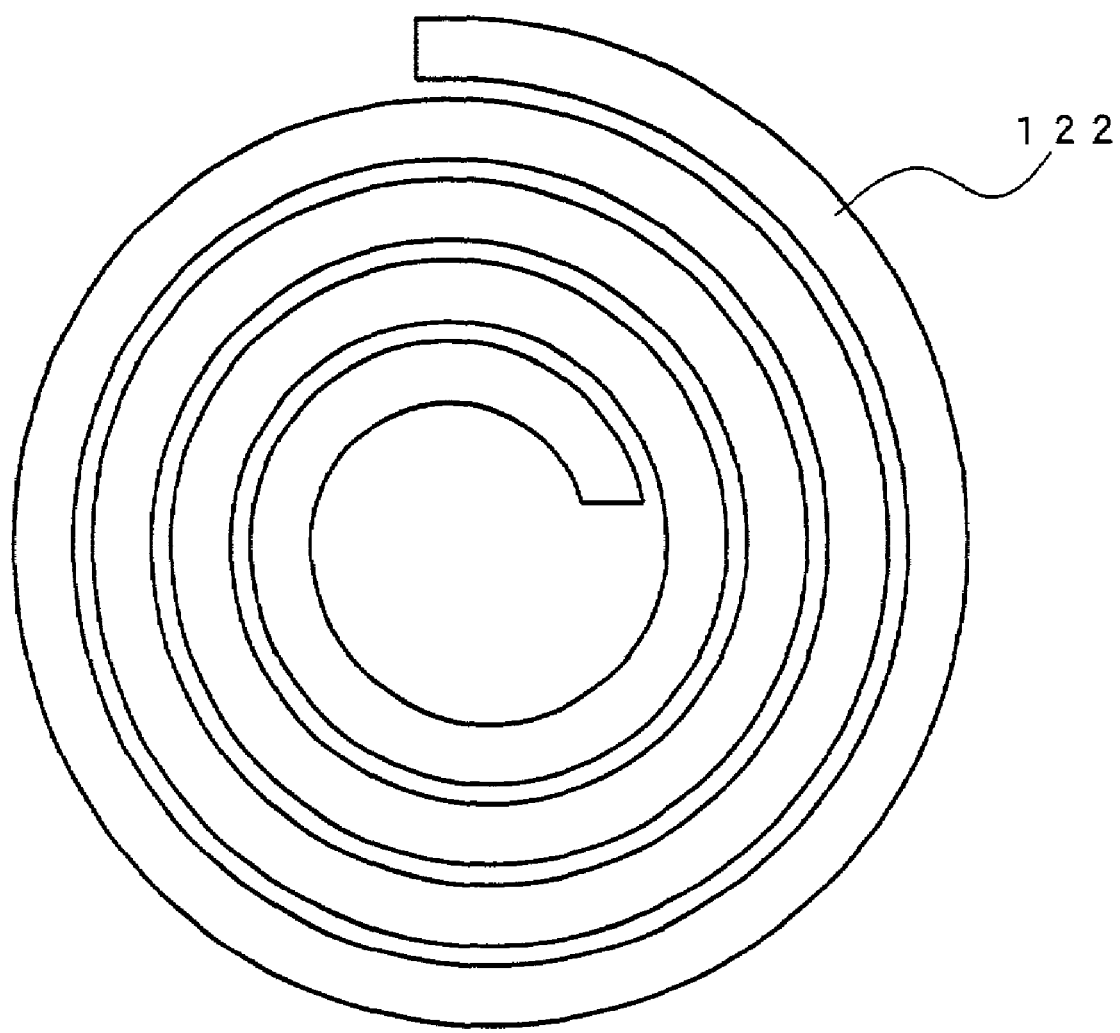
FIG. 3 is a drawing showing a shape of a lower layer of conductor included in the inductor element shown in FIG. 1.

FIG. 1 is a schematic diagram showing a planar structure of an inductor element according to the first embodiment. In addition, FIG. 2 is a drawing showing an upper layer of conductor included in the inductor element shown in FIG. 1. FIG. 3 is a drawing showing a shape of a lower layer of conductor included in the inductor element shown in FIG. 1.

An inductor element 100 according to this embodiment has two conductors 120 and 122 that have spiral shapes and are formed on the surface of a semiconductor substrate 110. These two conductors 120 and 122 have substantially the same shape. When viewed from the front side of the semiconductor substrate 110, they are formed so that the conductor 120, which becomes an upper layer, and another conductor 122, which becomes a lower layer, are formed by being superimposed one on the other substantially exactly. Each of the conductors 120 and 122 is formed of, for examples, a thin film of metal (metal layer), or semiconductor material such as poly silicon.

Figure 4:
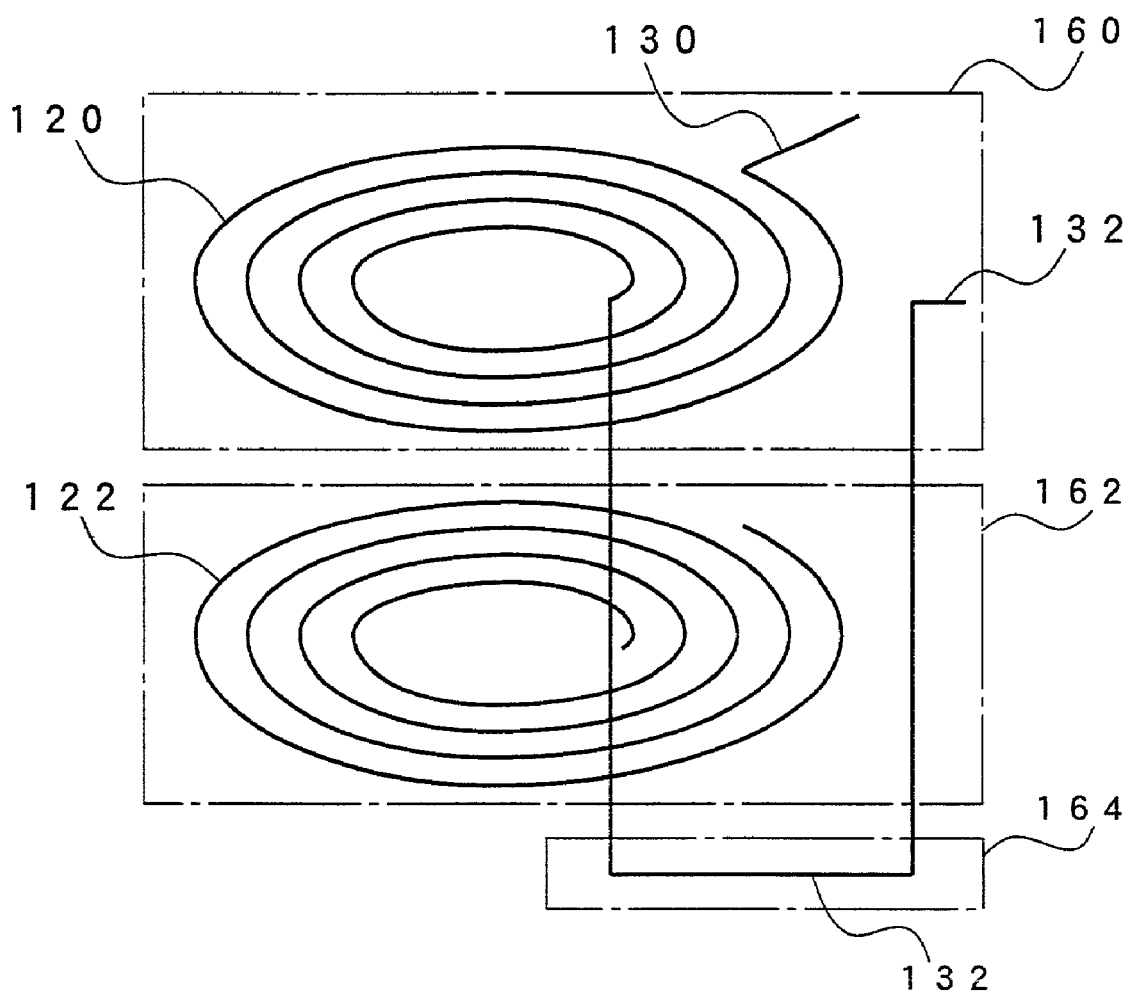
FIG. 4 is a drawing showing a connection state of two conductors included in an inductor conductor.

FIG. 4 is a schematic diagram showing a connection state of the two conductors 120 and 122, described above. As shown in FIG. 4, lead wires 130 and 132 are connected to an outer end (outer circumferential end) and an inner end (inner circumferential end) of the upper conductor 120 respectively. The lower layer conductor 122 electrically floats from a semiconductor substrate 110 and the upper layer conductor 120.

The upper conductor 120 functions as an inductor conductor, and is connected to a circuit (not shown) formed on the semiconductor substrate 110 through the lead wires 130 and 132 connected to ends thereof.

Figure 5:
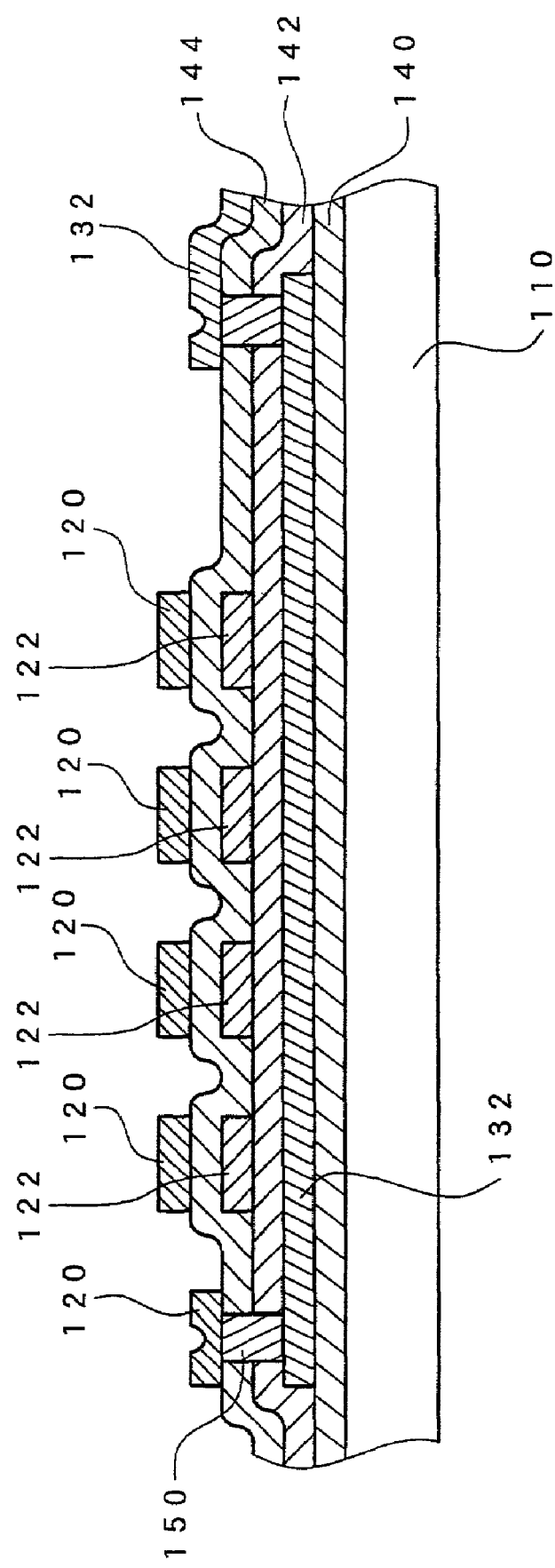
FIG. 5 is an enlarged sectional view taken on line V—V in FIG. 1.

FIG. 5 is an enlarged sectional view taken on line V—V in FIG. 1. As shown in FIGS. 4 and 5, at least three layers of metal layers 160, 162, and 164 are formed on the surface of the semiconductor substrate 110. One conductor 120 as an inductor conductor is formed with using a top layer of metal layer 160 that is most apart from the semiconductor substrate 110, and another conductor 122 is formed with using a middle layer of metal layer 162.

In addition, the lead wire 132 led out from the inner circumferential end of the top layer of conductor 120 is formed with using a bottom layer of metal layer 164 nearest to the semiconductor substrate 110. For example, as shown in FIG. 5, the inner circumferential end of the conductor 120 and one end of the lead wire 132 are connected through a through hole 150. The lead wire 132 formed from the bottom layer of metal layer 164 is led out outward so that the lead wire 132 may be orthogonal to each circumferential portion of the inductor conductor with a spiral shape. In addition, insulating layers 140, 142, and 144 are formed between the conductors 120 and 122, and the lead wire 132, which are formed with using three metal layers 160, 162, and 164, and the semiconductor substrate 110 respectively, and mutual insulation is performed.

An inductor element 100 in this embodiment has the structure described above. Since predetermined inductance appears between the lead wires 130 and 132 connected to both ends of the upper layer of conductor 120 respectively, this upper conductor 120 can be used as an inductor conductor. It is possible to separate the upper layer of conductor 120 from the semiconductor substrate 110 by forming a conductor 122, which has the substantially same shape as this conductor 120, under this upper layer of conductor 120. Hence it is possible to reduce eddy currents generated on the semiconductor substrate 110 and stray capacity produced between the upper layer of conductor 120 and the semiconductor substrate 110, and to make the upper layer of conductor 120 be effectively operative as an inductor conductor.

Furthermore, in the inductor element 100 in this embodiment, the lead wire 132 led out from the inner circumferential end of the upper layer of conductor 120 serving as an inductor conductor is formed with using the bottom layer of metal layer 164, and is located with being most apart from the inductor conductor through the other conductor 122. Hence it is possible to suppress to the minimum interruption of flow of the effective magnetic flux generated by the inductor conductor, and to obtain good characteristics. In this manner, the inductor element 100 in this embodiment can be formed with using at least three layers of metal layers 160, 162, and 164 on the surface of the semiconductor substrate 110. Hence it becomes possible to realize forming the inductor element 100 with other parts in one piece to perform integration on the semiconductor substrate 110.

SECOND EMBODIMENT

Figure 6:
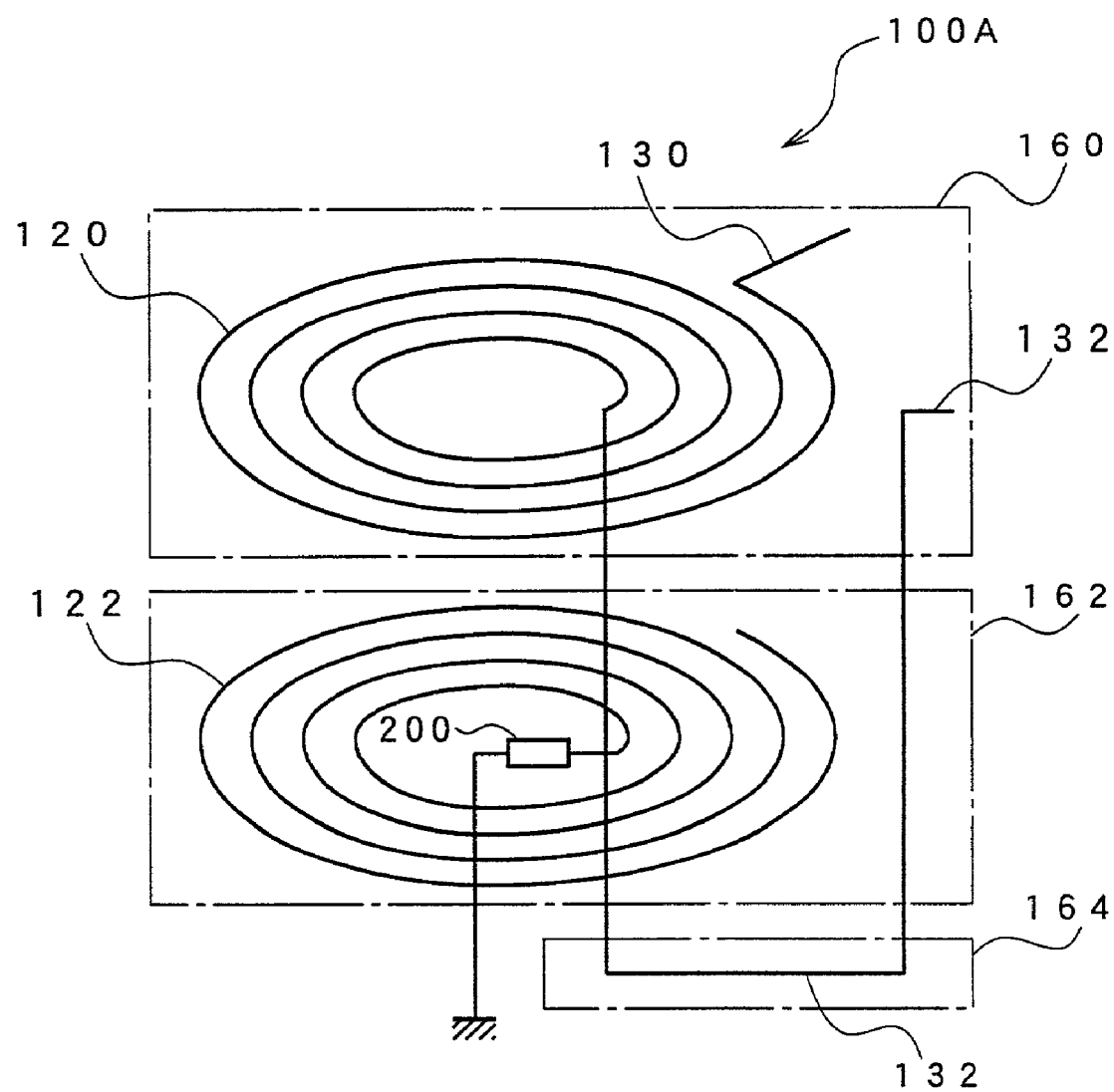
FIG. 6 is a schematic diagram showing a structure of an inductor element according to a second embodiment.

FIG. 6 is a diagram showing the structure of an inductor element 100A in a second embodiment. This is different in that a predetermined impedance element 200 is added to the inductor element 100 in the first embodiment shown in FIG. 4.

Namely, in the inductor element 100 in the first embodiment described above, with paying attention to the other conductor 122 located so as to substantially superimpose the one conductor 120 serving as an inductor conductor, both ends are free (open state). In this embodiment, the characteristics of the whole inductor element 100A can be improved or adjusted by terminating the inner circumferential end of the conductor 122 through the impedance element 200.

For example, when electric current flows into the one conductor 120 of the inductor element 00A, induced current flows to the other conductor 122. However, it becomes possible to prevent unnecessary reflection in this inner circumferential end by terminating the inner circumferential end of the other conductor 122 through the impedance element 200. In addition, it becomes easy to improve or change the frequency characteristic of a circuit including the inductor element 100A by adjusting or changing a device constant of the impedance element 200. For example, what is necessary to make a frequency low is just to use an inductor as the impedance element 200. On the contrary, what is necessary to make a frequency high is just to use a capacitor as the impedance element 200. Alternatively, the impedance element 200 can be formed with arbitrarily combining these, that is, an inductor, a capacitor, and a resistor.

In addition, a chip part of an inductor, a capacitor, or a resistor can be most easily used for the impedance element 200 described above. In addition, in consideration of forming two conductors 120 and 122, and the like, which constitute the inductor element 100A, on the semiconductor substrate 110 as shown by the cross-sectional structure in FIG. 5, it is desirable also to form the impedance element 200 on the semiconductor substrate 110 with using semiconductor manufacturing technology. For example, what is conceivable is to form a resistor with using a highly resistive material, to form a capacitor with making two layers of metal layers, having predetermined areas, face each other, or to form an inductor with using conductors having predetermined shapes. In addition, since the impedance element 200 is used as an element for termination, not-so-high Q is required even if this is realized with an inductor. For this reason, it also becomes possible to use an inductor constituted by forming a conductor with a predetermined shape (for example, a spiral shape) on the semiconductor substrate 110 as the impedance element 200.

Figure 7:
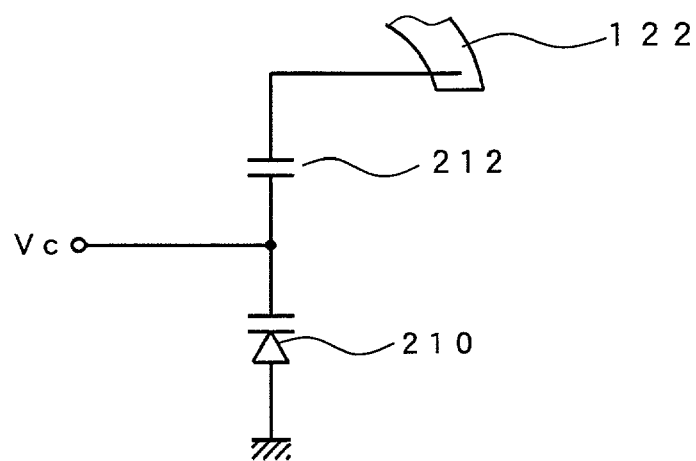
FIG. 7 is a drawing showing the structure in the case of connecting a variable capacitance diode to the inner circumferential end of a lower layer of conductor.

In addition, it is also good to use the impedance element 200 whose device constant can be changed by external control means. FIG. 7 is a diagram showing the structure in the case of connecting a variable capacitance diode 210 to the inner circumferential end of the conductor 122. The variable capacitance diode 210 operates as a capacitor with predetermined capacitance by using it in a reverse biased state, whose capacitance is changed by changing are verse bias voltage. This variable capacitance diode 210 is connected to the inner circumferential end of the conductor 122 through a capacitor 212 for DC component removal.

Figure 8:
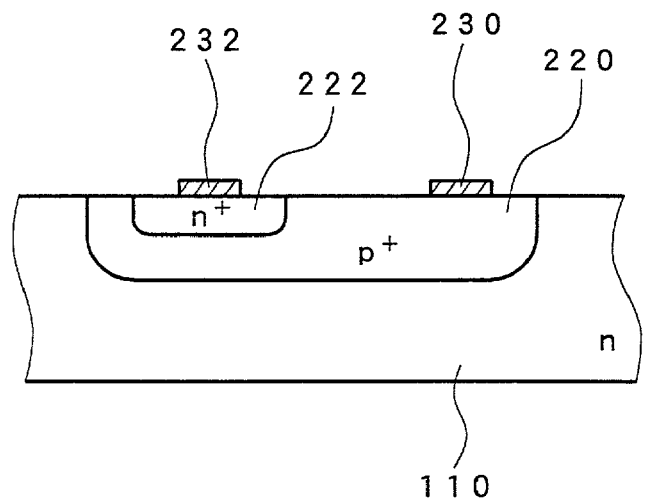
FIG. 8 is a drawing showing the cross-sectional structure in the case of forming the variable capacitance diode, shown in FIG. 7, on a semiconductor substrate.

FIG. 8 is a drawing showing the cross-sectional structure in the case of forming the variable capacitance diode 210, shown in FIG. 7, on the semiconductor substrate 110. As shown in FIG. 8, a p+ region 220 formed near the surface of the semiconductor substrate 110 formed of an n type silicon substrate (n-Si substrate) and an n+ region 222 further formed in a part thereof are included, and these p+ regions 220 and n+ region 222 form a pn junction layer. In addition, an electrode 230 for grounding is formed on the surface of the p+ region 220, and an electrode 232 for applying an variable reverse bias voltage as a control voltage Vc is formed on the surface of the n+ region 222. By applying the positive control voltage Vc to the electrode 232, the variable capacitance diode 210 whose capacitance changes according to the amplitude of this control voltage Vc can be formed.

Figure 9:
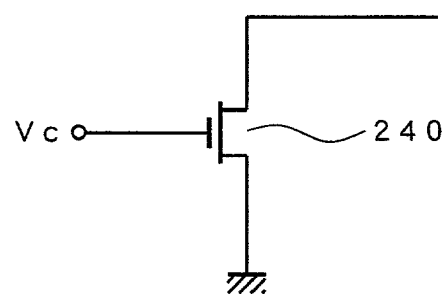
FIG. 9 is a diagram showing the structure in the case of connecting a variable resistor to the inner circumferential end of a lower layer of conductor.

FIG. 9 is a diagram showing the structure in the case of connecting a variable resistor, formed of an FET 240, to the inner circumferential end of the conductor 122. As shown in FIG. 9, the variable resistance is easily realizable by using a channel of the FET 240 as a resistor. By changing the control voltage Vc applied to a gate electrode, the resistance of the channel formed between a source and a drain can be changed. In addition, the FET 240 can be easily formed on the semiconductor substrate 110 by forming a source region and a drain region near the surface of the semiconductor substrate 110, and forming electrodes with predetermined shapes near regions in which the source region and the drain region and channels therebetween are formed.

Thus, it is possible to change termination conditions by terminating one end of the conductor 122 with using an impedance element whose device constant can be changed according to the control voltage Vc applied from the external. Hence, even if a frequency of a signal inputted into or outputted from the inductor element 100A is changed, it is possible to adjust the termination conditions according to the change, and hence, to improve characteristics.

Figure 10:
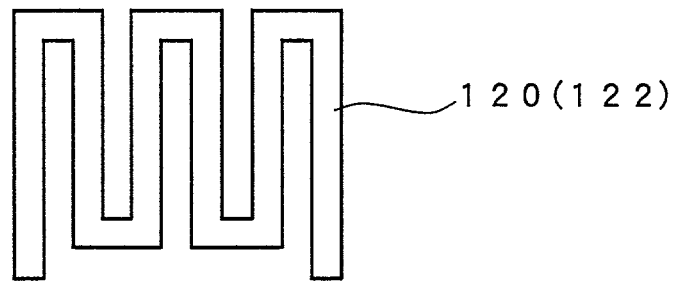
FIG. 10 is a schematic diagram showing a modified example of the conductor included in the inductor element.
Figure 11:
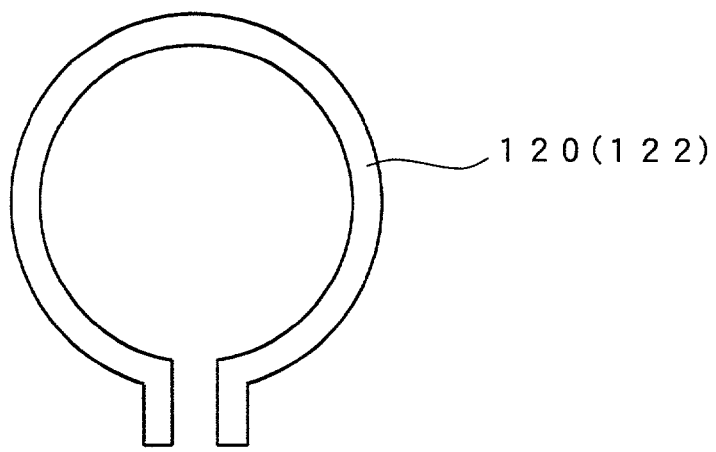
FIG. 11 is a schematic diagram showing a modified example of the conductor included in the inductor element.
Figure 12:
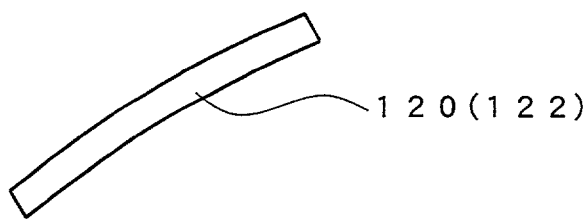
FIG. 12 is a schematic diagram showing a modified example of the conductor included in the inductor element.

The present invention is not limited to the above-described embodiments, but various types of modifications are possible within the scope of the gist of the present invention. For example, since two conductors 120 and 122 included in the inductor elements 100 and 100A are formed in spiral shapes in the embodiments described above, it is possible to realize the inductor elements 100 and 100A having large inductance. Nevertheless, it is also good to form two conductors 120 and 122 in meander shapes (FIG. 10). In addition, the inductance of these inductor elements 100 and 101A can be small when it is used as one part of a high frequency circuit. Hence it is also good to form the conductors 120 and 122 less than one turn by reducing the numbers of turns (FIG. 11), or to form it in a substantially linear shape (FIG. 12).

In addition, although the shapes of two conductors 120 and 122 are set substantially similarly in the embodiments described above, it is also good to set them in different shapes. For example, it can be also performed to set the number of turns of the lower conductor 122 to be more than that of the upper conductors 120. Thus, since the upper conductor 120 does not directly face the semiconductor substrate 110 if all or some of the lower conductor 122 is arranged under the upper conductor 120, it is possible to effectively prevent the generation of eddy currents due to the upper conductor 120.

In addition, although the inductor elements 100 and 100A are formed by forming two conductors 120 and 122 on the semiconductor substrate 110 in the embodiments described above, the inductor element in which two conductors 120 and 122 are formed on a conductor substrate such as a metal is also realizable. If it becomes possible to form the inductor elements 100 and 100A by closely contacting it on a conductor substrate, it also becomes possible to arrange the inductor elements 100 and 100A on a front side of a metal shielding case or the like. Hence it becomes easy to secure an installation space of the inductor element.

In addition, the inductor element 100A in the second embodiment described above is terminated at the inner circumferential end of the lower layer of conductor 122 by the impedance element 200. Nevertheless, it is also good to terminate an outer circumferential end through an impedance element, or to terminate both ends through each impedance element. When both ends of the conductor 122 are terminated through each impedance element, it is also good to make device constants of respective impedance elements different from each other.

INDUSTRIAL APPLICABILITY

As described above, according to the present invention, a conductor that is one of two conductors, and is apart from a substrate is used as an inductor conductor, and a lead wire of this inductor conductor passes between another conductor, being near to the substrate, and the substrate. Hence it is possible to suppress to the minimum the interruption of the flow of effective magnetic flux generated by the inductor conductor, and hence good characteristics can be obtained.

In addition, according to the present invention, electric current flows also to another conductor by effective magnetic flux generated by the inductor conductor. Nevertheless, by terminating one end of this other conductor by an impedance element, it becomes possible to prevent unnecessary reflection in this portion, and hence, to improve characteristics.

The invention claimed is:

1. An inductor element comprising two conductors, characterized in that they are formed in piles on a substrate in the state where they are mutually insulated, wherein one conductor apart from the substrate is used as an inductor conductor, and a lead wire of this inductor conductor is led out through a gap between another conductor, being near the substrate, and the substrate.

2. The inductor element according to claim 1, characterized in that three or more layers of metal layers are formed on the substrate, and the two conductors and the lead wires are formed respectively with using the metal layers which are different layers being mutually apart by one or more layers.

3. The inductor element according to claim 1, characterized in that the two conductors have substantially the same shape.

4. The inductor element according to claim 1, characterized in that the two conductors have long shapes.

5. The inductor element according to claim 1, characterized in that the two conductors have circular shapes less than one turn.

6. The inductor element according to claim 1, characterized in that the two conductors have spiral shapes each number of turns of which is one or more.

7. The inductor element according to claim 1, characterized in that the two conductors each have a spiral shape having one or more turns, and the lead wire led from the inner circumferential end of the inductor conductor is made to pass between the other conductor and the substrate.

8. The inductor element according to claim 1, characterized in that the two conductors are formed in substantially linear shapes.

9. The inductor element according to claim 1, characterized in that the two conductors are formed in meander shapes.

10. The inductor element according to claim 1, characterized by comprising:
    an inductance component of the inductor element; and
    a capacitance component between the two conductors.

11. An inductor element comprising two conductors, characterized in that they are formed in piles on a substrate in the state where they are mutually insulated, wherein one conductor of the two conductors that is apart from the substrate is used as an inductor conductor, and further, at least an end of the other conductor of the two conductors is terminated with a predetermined impedance element.

12. The inductor element according to claim 11, characterized in that it is possible to change at least one device constant of a resistor, a capacitor, and an inductor in the impedance element, and termination conditions are changed by making the device constant variable.

13. The inductor element according to claim 12, characterized in that the substrate is a semiconductor substrate, and the capacitor is formed of a variable capacitance diode made of a semiconductor layer formed in the inside or outside of the semiconductor substrate.

14. The inductor element according to claim 12, characterized in that the substrate is a semiconductor substrate, and the resistor is formed of a channel of an FET made of a semiconductor layer formed in the inside or outside of the semiconductor substrate.

15. The inductor element according to claim 11, characterized in that the two conductors have substantially the same shape.

16. The inductor element according to claim 11, characterized in that the two conductors have long shapes.

17. The inductor element according to claim 11, characterized in that the two conductors have circular shapes less than one turn.

18. The inductor element according to claim 11, characterized in that the two conductors have spiral shapes each number of turns of which is one or more.

19. The inductor element according to claim 11, characterized In that the two conductors are formed in substantially linear shapes.

20. The inductor element according to claim 11, characterized in that the two conductors are formed in meander shapes.

21. The inductor element according to claim 11, characterized by comprising:
  an inductance component of the inductor element; and
  a capacitance component between the two conductors.

* * * * *